United States Patent [19]

Cantor et al.

[11] Patent Number: 5,712,321
[45] Date of Patent: Jan. 27, 1998

[54] DUAL-CURING COATING FORMULATION AND METHOD

[75] Inventors: Stephen E. Cantor, Cheshire; Brian Bachmann, Harwinton, both of Conn.

[73] Assignee: Dymax Corporation, Torrington, Conn.

[21] Appl. No.: 595,393

[22] Filed: Feb. 1, 1996

[51] Int. Cl.$^6$ .................................................. C08F 2/46
[52] U.S. Cl. ........................... 522/28; 522/29; 526/147; 526/192
[58] Field of Search .................. 522/28, 29; 526/147, 526/192

[56] References Cited

U.S. PATENT DOCUMENTS

| | | | |
|---|---|---|---|
| H509 | 8/1988 | Chan | 526/264 |
| 2,414,089 | 1/1947 | Bruson . | |
| 2,859,200 | 11/1958 | Lappala . | |
| 2,921,045 | 1/1960 | DiMartino . | |
| 3,658,624 | 4/1972 | Lees | 156/310 |
| 4,052,244 | 10/1977 | Skoultchi | 156/310 |
| 4,126,504 | 11/1978 | Wolinski et al. | 156/310 |
| 4,346,027 | 8/1982 | Van Eenam | 524/377 |
| 4,348,503 | 9/1982 | Bachmann | 525/455 |
| 4,424,252 | 1/1984 | Nativi | 428/209 |
| 4,429,088 | 1/1984 | Bachmann | 526/135 |
| 4,432,829 | 2/1984 | Bachmann | 156/307.3 |
| 4,451,523 | 5/1984 | Nativi et al. | 428/209 |
| 4,820,744 | 4/1989 | Kubota et al. | 522/13 |
| 4,945,143 | 7/1990 | Hardiman et al. | 526/206 |
| 4,956,221 | 9/1990 | Gutek | 428/142 |
| 4,963,220 | 10/1990 | Bachmann et al. | 156/307.3 |
| 4,964,938 | 10/1990 | Bachmann et al. | 156/273.7 |
| 5,039,715 | 8/1991 | Bachmann et al. | 522/13 |
| 5,164,127 | 11/1992 | Boeckler | 264/22 |
| 5,256,446 | 10/1993 | Bogen | 427/163 |
| 5,288,523 | 2/1994 | Klaiber et al. | 427/385.5 |
| 5,393,800 | 2/1995 | Goosclaude et al. | 527/28 |

OTHER PUBLICATIONS

Santolink XI–100 Manufacturer's Product Bullentin (Monsanto) (Sep., 1989).

*Primary Examiner*—Mark Chapman
*Attorney, Agent, or Firm*—Ira S. Dorman

[57] ABSTRACT

The polymerizable acrylate formulation, and method utilizing the same, employ a catalyst system that includes a tertiary aromatic amine compound and an air-curing polyether-ene polymer, in a specified ratio, in combination with an acid ingredient and a transition metal that together form a coordination compound. The formulation cures through bulk, as well as on the surface, in a highly effective manner.

39 Claims, No Drawings

DUAL-CURING COATING FORMULATION AND METHOD

BACKGROUND OF THE INVENTION

Conformal coatings are commonly applied to printed circuit boards and electronic components to provide protection against chemical attack, moisture, air-borne contaminants, and the like, as well as against mechanical shock and vibration encountered in shipping and use.

First-generation conformal coatings, based upon acrylic, epoxy, silicone, and polyurethane chemistries, are often found disadvantageous from any of several standpoints; for example, application may be difficult, pot-life or processing speed may be inadequate, curing may require stringent or extreme conditions, they are typically solvent based and reaction may be accompanied by off-gassing of volatile organic compounds, etc.

The commercialization of conformal coatings that cure by actinic radiation (normally, ultraviolet light) has obviated many of the foregoing disadvantages. Such products are usually solventless, one-part systems that cure rapidly to a tack-free surface and that afford superior adhesion and good chemical, moisture and abrasion resistance.

As conventionally formulated, however, polymerization of photoinitiated compositions occurs only in those regions that have been subjected to the activating radiation, with secondary cure mechanisms being required to effect polymerization in unirradiated "shadow" areas. One secondary cure mechanism commonly utilized relies upon the addition of a heat-activated peroxide to the formulation; temperatures in excess of 100° Centigrade are however normally required to initiate peroxide-induced polymerizations, thus precluding use where, for example, heat-sensitive electronic components are involved. Moisture-reactive free isocyanates have been used to provide shadow-cure properties as well, but health and environmental concerns have limited their acceptance.

There is a class of products available that employ an oxygen-sensitive monomer and a metal drier to generate a peroxide in situ, for initiation of the secondary reaction. Such available products are however relatively slow to react, typically requiring many days to fully cure as, for example, a three-mil coating, and virtually precluding use in thickness of ten mils or more, as a practical matter. In general, moreover, the dual-curing products provided heretofore have tended to produce substantially different cross-link densities from area to area, depending upon the conditions of initiation and curing; also, the rate of reaction in unexposed regions will normally vary in substantially direct proportion to thickness of the deposit (as would be expected).

U.S. Pat. No. 2,414,089, to Bruson, provides allylic ester compounds suitable for use as coating materials in combination with metallic driers.

VanEenam U.S. Pat. No. 4,346,027 describes a composition that confers an enhanced balance of wet and dry strength properties to a cellulose substrate; the composition includes a polyether-ene polymer and a transition metal drier salt. The patent is not concerned with acrylic monomer-based photoinitiated coating compositions.

U.S. Pat. No. 4,451,523, to Nativi et al, discloses a one-component, UV-curable acrylate conformal coating system in which a (meth)acrylate reactive diluent having at least one allylic reactive bond, and a metal drier, provide a secondary cure mechanism.

U.S. Pat. No. 5,256,446, to Bogen, provides a radiation-curable metallization primer comprised of an acrylate copolymer, a monomer or oligomer containing three acryloyl groups, a polyether-ene aliphatic oligomer, and a photoinitiator.

The manufacturer's product bulletin for Santolink XI-100 describes a polyunsaturated aliphatic liquid oligomer containing 20 allyloxy hydrogens in the molecule, and describes transition metal-catalyzed reactions of formulations containing the same, and applications therefor; solvent, heat, or a peroxide catalyst is relied upon to effect curing.

Two-part acrylate formulations are well known in the art for use as adhesives, potting compounds, conformal coatings, and the like. In addition to including polymerizable acrylate monomers, such formulations typically include elastomeric fillers (e.g., urethane oligomers, preferably capped to provide sites of unsaturation for enhanced reactivity), adhesion promoters in the form of organic acids (e.g., acrylic and methacrylic), inert fillers, supplemental adhesion promoters (e.g., silanes), leveling agents, and other ingredients. Reaction in formulations of this kind is normally initiated by use of a free-radical, active-oxygen catalyst (i.e., a peroxide, a hydroperoxide, or a perester), activated thermally, chemically (e.g., with an amine/aldehyde adduct and transition metal accelerator), aerobically, anaerobically, etc; they may additionally or alternatively include a photoinitiator that is responsive to actinic radiation.

Illustrative of the prior art that is germane to the acrylate formulations hereinabove referred to are the following Bachmann and Bachmann et al U.S. patents, all of which are of common assignment herewith to Dymax Corporation of Torrington, Conn.: U.S. Pat. No. 4,348,503, issued Sep. 7, 1982, U.S. Pat. No. 4,429,088, issued Jan. 31, 1984, U.S. Pat. No. 4,432,829, issued Feb. 21, 1984, U.S. Pat. No. 4,963,220, issued Oct. 16, 1990, U.S. Pat. No. 4,974,938, issued Oct. 23, 1990, and U.S. Pat. No. 5,039,715, issued Aug. 13, 1991.

Other prior art of interest to the subject matter to which the instant application pertains are the following, each of which is also a patent of the United States: Lappala, U.S. Pat. No. 2,859,200, issued Nov. 4, 1958, DiMartino U.S. Pat. No. 2,921,045, issued Jan. 12, 1960, Lees U.S. Pat. No. 3,658,624, issued Apr. 25, 1972, Skoultchi U.S. Pat. No. 4,052,244, issued Oct. 4, 1977, Wolinski et al U.S. Pat. No. 4,126,504, issued Nov. 21, 1978, Nativi U.S. Pat. No. 4,424,252, issued Jan. 3, 1984, Kubota et al U.S. Pat. No. 4,820,744, issued Apr. 11, 1989, Gutek U.S. Pat. No. 4,956,221, issued Sep. 11, 1990, and Chao Registration No. H509, published Aug. 2, 1988.

The Lappala and DiMartino patents disclose the combined use of a number of ingredients for the catalysis of acrylate systems; for example, DiMartino describes a methylmethacrylate cement that includes methacrylic acid and is catalyzed by cobalt naphthenate, MEK peroxide, and diethylaniline, used in combination. The Lees patent lists complimentary accelerators, including a monocyclic carbocyclic aromatic acid (e.g., benzoic), trichloroacetic acid, and phenoxyacetic acid. The two-part adhesive disclosed by Skoultchi includes p-toluene sulfinic acid, and Wolinski et al disclose a system that includes an acid (e.g., acrylic) and a free-radical, active-oxygen catalyst (e.g., benzoyl peroxide), in which reaction is initiated by a tertiary amine (e.g., dimethyl-p-toluidine). Both Nativi and Gutek provide compositions that afford shadow curing capability, and Gutek discloses UV-curing as being suitable for printed circuit board applications.

U.S. Pat. No. 5,393,800, which is also of common assignment herewith, describes a two-component system in which polymerization of a formulation containing acrylates and oligomers is effected in the absence of any free-radical, active-oxygen catalyst (i.e., peroxide, a hydroperoxide or a perester), but in the presence of a tertiary amine/metal/organic acid catalyst combination. One disadvantage associated with this system is attributable to the phenomena known as "oxygen inhibition," which may cause the surface of the deposit to remain wet and tacky despite full reaction of the bulk mass to a tough, hard, insoluble high polymer matrix.

In copending and commonly assigned Cantor et al application Ser. No. 08/437,842, polymerizable compositions are described in which curing occurs through a mechanism that involves reaction of a polyallyloxy polyol ingredient with oxygen to form hydroperoxide moieties in situ. The hydroperoxide moieties are converted to active radical sources in the presence of metal catalysts, which radicals serve in turn to effect curing of the composition. Since the Cantor et al reaction relies upon oxidation of the polyallyloxy polyol, however, the presence of any impediment to air flow will retard, and may indeed preclude, the drying reaction. This phenomenon is noted for example in conformal coating of computer boards, in which the components are mounted in very close proximity to the surface of the board, due to the formation of a dam or barrier upon initial curing of the formulation. The secondary mechanism cannot occur in the areas that are thereby isolated from an oxygen-rich environment.

A demand therefore exists for a formulation that is suitable for use for adhesive bonding, potting, conformal coating, and for similar applications, which formulation cures in a highly effective manner on the surface of the deposit as well as throughout its mass.

SUMMARY OF THE INVENTION

Accordingly, it is a broad object of the present invention to provide a novel liquid formulation that is capable of reaction at practical rates to produce, in a highly effective manner, a deposit that is fully cured throughout its mass and fully dry at its surface.

Related objects of the invention are to provide a novel catalyst system, and a novel method for the production of an adherent deposit in a highly facile and yet efficient manner, utilizing a formulation of the character described.

It has now been found that certain of the foregoing and related objects of the invention are attained by the provision of a liquid formulation that is innately curable to an adhesive solid, comprising a polymerizable composition that includes one or more oxygen-containing ethylenically unsaturated polymerizable ingredients; an acid ingredient that is substantially soluble in the polymerizable composition; a tertiary aromatic amine compound; a compound of a transition metal that is capable of forming a coordination compound with the acid ingredient; and an air-curing polyether-ene polymer containing at least three activated double bonds per molecule. The amine and the polyether-ene polymer are present in the formulation in an amine:polyether-ene mole ratio below 0.4:1.0, and the formulation is free from any free-radical, active-oxygen polymerization catalyst (i.e., a compound containing the peroxy group) as well as from any acrylated carbonate polymers.

In preferred embodiments, the aromatic amine compound employed will have the structural formula:

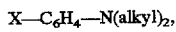

wherein X is an election-donating group in the para or meta ring position, and is most desirably t-butyl, methyl, methoxy or hydrogen, and wherein each of the alkyl groups contains one to three carbon atoms; the amine:polyether-ene mole ratio will preferably be in the range of 0.08 to 0.37:1.0. The metal compound utilized in the formulation will normally be of a metal selected from the class consisting of cobalt, cerium, manganese and vanadium, and the acid or acids employed will normally be selected from the class consisting of acrylic, methacrylic, acetic, ascorbic, oxalic, phthalic, itaconic, crotonic, 4-methoxyphenyl acetic, 3,5-dihydroxybenzoic, 3,3-dimethylaminobenzoic, and p-toluenesulfonic. Best results will generally be produced when cobalt is used as the metal, and when acrylic acid, methacrylic acid, or acetic acid comprises the acid ingredient.

The polyether-ene polymer will preferably be an allyloxy compound, especially one containing at least ten allyloxy groups in the molecule. Most desirably, the composition will comprise 10 to 20 parts of such an allyloxy compound; more particularly, the allyloxy compound will have the structural formula:

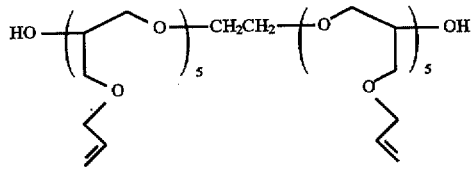

The composition may further include 1 to 10 parts of a reactive diluent selected from the class consisting of vinyl ethers, epoxides, and vinyl amides, in which instances a cationic initiator (active or latent) may be incorporated to enable curing to be effected by that mechanism as well. The polymerizable ingredient will preferably be an acrylate monomer, usually admixed with a prepolymer selected from the group consisting of urethane (meth)acrylates, epoxy (meth)acrylates, and urethane epoxy-(meth)acrylates. In most instances, the formulation will include an effective amount of a photoinitiator that is capable, when activated, of catalyzing polymerization of the polymerizable ingredient.

The formulation may more specifically comprise (in percentages based upon the total weight thereof) 0.05 to 10, and preferably 1 to 4, of the acid ingredient, 0.05 to 0.75 of the aromatic amine compound, 0.002 to 1.5 of the metal compound, 5 to 25, and preferably 10 to 20, of the polyether-ene polymer, and 15 to 85 of the polymerizable composition. When included, the prepolymer may constitute as much as 50 weight percent of the formulation, and more typically 20 to 40 percent thereof.

The acid and aromatic amine ingredients will normally be segregated from one another, in separate components, until they are admixed for use, and the polyether-ene polymer and the metal-containing compound may be similarly segregated for maximum shelf life. Thus, one component of the formulation will typically contain the amine and the polyether-ene polymer, and another will typically contain the acid and the metal ingredients, with each component containing at least a portion of the reactive monomer(s) and oligomer(s).

Other objects of the invention are attained by the provision of a system comprised of the catalytic ingredients of the described formulation, and additional objects are attained by the provision of a method for the production of an adherent solid deposit upon a substrate, utilizing the formulation described. Admixture of two components comprising the formulation may be effected immediately prior to their contact with the substrate, as by interspersal of fine-droplet sprays thereof in the manner described in the above-mentioned U.S. Pat. No. 5,393,800.

DETAILED DESCRIPTION OF THE PREFERRED EMBODIMENTS

Exemplary of the efficacy of the present invention are the following Examples, in which all parts and percentages stated are by weight and in which all reactions are effected under ambient conditions. Except where other products are identified, the prepolymer used in these Examples is a polyetherurethane acrylate oligomer produced from an aromatic isocyanate and a polypropyleneoxide diol, and capped with 2-hydroxyethylacrylate, which is commercially available from Bomar, Inc., of Winsted, Conn.; it has a molecular weight of about 1000, and contains only trace amounts of terminal isocyanate. The Irgacure products referred to are commercially available from Ciba Chemical Company and are defined below; the cobalt octoate is employed as a 12% solution throughout; and Santolink Xl-100 is commercially available from Monsanto Chemical Corp. and is a polyallyloxy polyol containing approximately twenty allyloxy hydrogens in its molecule and having the structural formula:

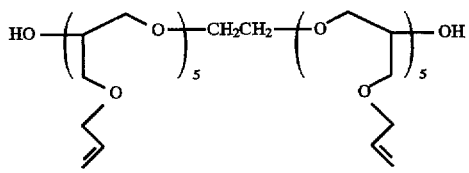

EXAMPLE ONE

Two components of a reactive formulation, each having a viscosity of approximately 150 centipoise at 25° C., are prepared respectively by mixing the following ingredients in the amounts (parts) set forth in parenthesis:

Part A—isobornylacrylate (36), aromatic polyetherurethane acrylate oligomer (28.6), Irgacure 184 (2.4), Irgacure 651 (1.8), triethylene glycol divinyl ether (5.8), Santolink Xl-100 (25), and N,N-dimethyl-p-toluidine (0.4);

Part B—2-hydroxyl ethyl methacrylate (10), isobornyl acrylate (51), acrylic acid (2.2), aromatic polyetherurethane acrylate oligomer (35), Irgacure 184 (2.0), Irgacure 651 (1.6), cobalt octoate solution (0.33).

Equal portions of Part A and Part B are admixed and sprayed onto a printed circuit board (PCB) substrate, which carries a 1×4 inch steel lap mounted in such a manner as to produce an inclined plane, the spray being so directed as to cause a portion of the mixture to flow below the metal lap.

The resultant damp board is exposed to ultraviolet radiation for a period of five seconds, using a lamp rated at 3.5 joules/cm$^2$, following which the exposed surface of the coating is found to be tack-free. After a 48-hour rest period at room temperature, the unirradiated areas under the surface of the metal lap are examined and are found to be cured throughout the length of the shadow area, irrespective of the elevation of the plane. That is, in the regions of minimal lap-to-board separation, where a UV-cured outer dam has formed, the formulation is well cured, being as dry as it is in the area of maximum height (at the open end of the inclined plane) where no impediment to oxygen flow is presented.

EXAMPLE TWO

A component C is prepared to contain the same ingredients as component A of Example One, excepting only that the Santolink Xl-100 is omitted. Equal portions of component B (formulated as in Example One) and component C are mixed and sprayed onto a fiberglass/epoxy resin (FR-4) board; some of the mixture is also poured into a plastic beaker.

The surface of the FR-4 board is partially obscured by a metal tent in such manner that only about half of its area is exposed. The shadow area lying under the tent remains wet after irradiation of the board, from above the tent, for five seconds utilizing the light source described in Example One, whereas the exposed area cures to a tough, dry clear solid; despite being allowed to remain at room temperature for several days, the shadow area remains wet.

The bulk of the material contained in the plastic beaker (which is not irradiated) forms a tough, hard plug in 24 hours. Even after two weeks' time, however, the surface of the plug, exposed to the atmosphere, remains tacky and damp to the touch.

EXAMPLE THREE

Components similar to Parts A and B of Example One are treated with 6% and 7%, respectively, of Aerosil A-300 (fumed silica, available from Degussa Corporation) to produce viscous gels. The gels are loaded separately into the barrels of a dual-cartridge, hand-held mixing gun; they mix in the delivery tip (a Mixpec System 50 part), and are dispensed as a bead onto the surface of an FR-4 board. After two hours' time, the mass of the bead is found to be fully cured, whereas the surface remains tacky and wet; after 24 hours' time, however, the surface is found to be dry to the touch.

EXAMPLE FOUR

The procedure of Example One is repeated, using the reactive formulation described therein but varying the amounts of Santolink Xl-100 and N,N-dimethyl-p-toluidine employed. The percentage of Santolink employed is either 25, 35 or 45, based upon the total weight of the Part A component; at each level, an amount of the toluidine corresponding to 0.4, 1.0, 2.0 and 4.0 percent of Part A is employed. Utilizing 135 as the molecular weight of the toluidine, and 1200 as the average molecular weight of the Santolink, amine:polyether-ene polymer molar ratios of 0.082:1.0, 0.103:1.0, 0.148:1.0, 0.200:1.0, 0.255:1.0, 0.370:1.0, 0.400:1.0, 0.512:1.0, 0.740:1.0, 0.800:1.0, 1.0:1.0 and 1.48:1.0 are therefore tested.

In all instances, full reaction through the bulk of the formulation occurs, within a matter of minutes, following admixture of Part A with Part B and exposure to UV radiation, of the stated power rating, for five seconds. Each of the formulations in which Part A contains an amine:polyether-ene polymer ratio in the range 0.082 to 0.370:1.0 air dries however in a period of 48 hours or less, whereas the remaining formulations (i.e., those containing ratios of 0.400 to 1.48:1.0) fail to dry within that period.

EXAMPLE FIVE

The procedure of Example One is substantially repeated, using formulations in which the N,N-dimethyl-p-toluidine is replaced with an equimolar amount of each of the following aromatic amine compounds:
A. p-tert-butyl-N,N-dimethyl aniline
B. N,N-dimethyl aniline
C. N,N-dimethyl benzophenone
D. N,N-dimethyl-m-toluidine.

Although in all instances the formulations cure satisfactorily, both on the surface of the deposit and also through its volume, the results produced by p-tert-butyl-N, N-dimethyl aniline are most notable and are superior to the results achieved with the other designated compounds.

The acid constituent of the instant formulation functions as one component of the catalyst system; it is believed to form a coordination compound with the transition metal, which mechanism is thought to be essential to the functionality of the formulations. Organic acids employed can be aromatic, aliphatic or aryl-aliphatic, and typical examples have been provided hereinabove. The acid need not be a carboxylic acid, and may for example be a sulfonic acid or, indeed, an inorganic acid such as hydrochloric or sulfuric. Although no specific pK values appear applicable, it has been observed that acids of excessive strength can effectively preclude a polymerization reaction that would otherwise take place if a weaker acid were used.

A second essential ingredient of the catalyst system is the tertiary aromatic amine. As will be appreciated, the aromatic ring may be monocyclic or polycyclic (e.g., a coumarin, fulvene or naphthalene derivative), and the chemical species and position of ring substitution may vary. It should be noted however that, as indicated by Example Five hereinabove, the ring substituent (if any) of the aromatic amine employed must evidently be electron donating and have a positive σ value in the so-called Hammett Equation (Hammett, *Physical Organic Chemistry*, McGraw-Hill Book Co., Inc., New York, 1940, pp. 184–199; Jaffe, *Chem. Revs.*, 53, 191 (1953)); stearic hindrance should also be avoided in the molecule. Consequently, the preferred substituents of the aromatic amine will usually be in the meta or, most desirably, the para position relative to the nitrogen atom; and to avoid stearic hindrance (as well as for other reasons) monocyclic amines will generally be preferred over the polycyclic compounds.

The third essential ingredient of the catalyst system is the transition metal compound. Although various species have been listed hereinabove and may be employed, the cobalt ion will generally be found to be most effective herein and is highly preferred. In any event, suitable metal ion-source compounds will be evident to those skilled in the art, exemplary of which are: cobaltous naphthenate, ferric sulfate, cerium naphthenate, cupric naphthenate, manganese naphthenate, cobaltic acetylacetonate hydrate, vanadium acetylacetonate, and lead linoleate. The metal compound concentration may vary widely, and will depend to an extent upon the other ingredients of the system and the results desired; however, the concentration will generally be such as to provide an amount of the metal ion in the formulation ranging from a trace to perhaps one part per thousand, and typically 0.3 to 1.0 weight percent of a 12% cobalt octoate solution will be employed. It has been shown that increasing the amount of metal ion present can produce a correspondingly pronounced affect upon the rate of cure, albeit that relatively high concentrations may cause excessive coloration.

The final essential ingredient of the catalyst system is the air-curing polyether-ene polymer, a full description of which is provided under the heading "THE AIR-CURING POLYMER COMPONENT," set forth in columns 3 through 8 of VanEenam U.S. Pat. No. 4,347,027, which description is hereby incorporated hereinto by reference thereto. Suffice to say that the air-curing polymers suitable for use as the polyether-ene polymer ingredient has a backbone comprising at least one segment having the formula:

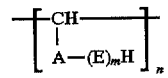

wherein A is a moiety terminating in the residue of an active hydrogen-containing group selected from the group consisting of alcoholic hydroxyl, thiol, amide, carboxylic acid and secondary amine with an active hydrogen removed, E is a moiety containing a radical having an activated olefinic unsaturation, either α, β or β, γ to the activating group, n is the number of adjacent (as the term is hereinafter defined) segments having this formula, and n and m are integers and are each at least 1, provided that where one is less than 4 the other is at least 4.

The polyether-enes can have a plurality of adjacent segments of the above formula, by which term "adjacent" is meant that they are directly connected through a carbon-carbon bond or are indirectly connected through a

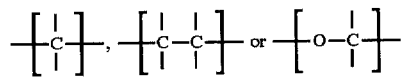

group or an oxygen or sulfur atom.

As pointed out in the VanEenam patent, the effectiveness of the polyether-enes depends to a large extent on the provision of a plurality of activated double bonds in blocks which are spatially closely related. These double bonds are sites at which oxygen-initiated crosslinking takes place during the drying or accelerated or natural ageing process. Thus, the provision of blocks of activated double bonds, each of which can provide a bond site, increases the potential crosslink density as well as the structural strength of the crosslinks that form inter- and intra-molecularly during drying and/or ageing. In accordance with the instant invention, the polyether-ene molecule will include at least three activated double bonds.

By virtue of their proximity in the polymer molecule to other strongly electron-donating groups, the double bonds are activated; i.e., they are more ready to form crosslinks during the air drying process. Examples of such electron-donating groups include ether, sulfide, hydroxyl, carboxyl, and olefinically unsaturated groups, but the preferred electron-donating group in the polyether-ene molecule, is an ether group. As will be appreciated from the foregoing Examples, the air curing polymer that is most desirably employed in the instant formulations is Santolink XI-100.

It will also be appreciated from the Examples that the molar ratio of tertiary aromatic amine compound to polyether-ene polymer should not exceed 0.4:1.0, and should preferably be 0.37:1.0 or below. As a practical matter, the ratio should not be lower than 0.05:1.0, with the preferred lower limit being 0.08:1.0.

Reactive acrylate monomers that are suitable for use in the instant formulations include of course both monofunctional and polyfunctional acrylates and methacrylates. They will generally be reaction products of acrylic acid and/or methacrylic acid with one or more mono- or poly-basic, substituted or unsubstituted, alkyl ($C_1$ to $C_{18}$), aryl or aralkyl alcohols. Acrylates in which the alcohol moiety contains a polar substituent (e.g., an hydroxyl, amine, halogen, cyano, heterocyclic or cyclohexyl group) will often be preferred because crosslinking, or other intermolecular bonding, is promoted thereby. Suitable such monomers are well known in the art, and are in part disclosed for example at line 53, column 6, through line 35, column 7 of Bachmann et al U.S.

Pat. No. 4,429,088, and at line 14, column 4 through line 52, column 5 of U.S. Pat. No. 4,451,523. Nevertheless, it might be noted that the following acrylates and corresponding methacrylates (the methacrylate compounds being preferred in many instances) are especially suitable for use in the present compositions, alone or in combination with one another: hydroxyethylacrylate, isobornyl acrylate, tetrahydrofurfuryl acrylate, diethyleneglycol diacrylate, 1,4-butanediol diacrylate, butylene glycol diacrylate, neopentyl glycol diacrylate, octylacrylate and decylacrylate (normally in admixture), polyethyleneglycol diacrylate, trimethylcyclohexyl, benzyl acrylate, butyleneglycol diacrylate, polybutyleneglycol diacrylate, tripropyleneglycol diacrylate, trimethylolpropane triacrylate, di-trimethylolpropane tetraacrylate, pentaerythritol tetraacrylate, and di-pentaerythritol pentaacrylate. About 1 to 10 weight percent of acrylic acid will beneficially be employed, to increase adhesion.

A free-radical reactive oligomer will normally be included in the composition (alone or, where appropriate, in combination with a cationic-reactive oligomer), but it should be appreciated that such a product is not necessary to the attainment of the cure properties desired herein. Oligomers suitable for use are also well known in the art, and comprise vinyl polymers, acrylic polymers, polyester elastomers, glycol polymers, acrylated epoxies, natural and synthetic rubbers, polyester acrylates, epoxy acrylates, polyether acrylates, alkyd acrylates, polyol acrylates, and the like. However, the use of the urethane polymers and prepolymers will often be found most beneficial, with the latter being especially desirable due to the potential that they afford for further reaction of their pendant isocyanate groups with a reactive functionality (e.g., an hydroxyl group) provided by a suitable acrylate monomer. Diisocyanate-capped polyethers and polyesters, acrylated by reaction with hydroxyethyl acrylate or hydroxyethyl methacrylate and having a molecular weight of about 400 to 6,000, are particularly preferred.

Vinyl ether reactive diluents used herein will usually conform to the structural formula:

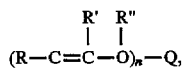

in which formula each of the substituents R, R' and R" independently represents an hydrogen atom, an aliphatic group, or an aromatic group; n is an integer, usually having a value from 1 to 6; and Q represents an aliphatic group, an aromatic group, an alkoxy group, a cycloaliphatic group, an ester group, a polyester group, an ether group, a polyether group, a carbamide group, a carbamate group, an heterocyclic group, or the like, each of such groups optionally being further substituted by an hydroxyl or a vinyl group, or both. Vinyl ether-terminated ester monomers and vinyl ether-terminated aromatic urethane oligomers may find utility herein, and it is believed that analogous compounds in which a sulfur atom replaces the oxygen of the ether group(s) may be used as well (alone or in combination) as a diluent ingredient.

Suitable specific vinyl ether compounds include the following: triethylene glycol divinyl ether, 1,4-cyclohexane dimethanol divinyl ether, propenyl ether of propylene carbonate, n-dodecyl vinyl ether, hydroxybutyl vinyl ether, cyclohexyl vinyl ether, and tetrahydrofurfuryl vinyl ether. Exemplary epoxy compounds that may be employed include 3,4-epoxy-cyclohexylmethyl-3,4-epoxy-cyclohexanecarboxylate, bis-(3,4-epoxycyclohexyl)adipate, diglycidyl ether of bisphenol A, and epoxidized soybean oil. Among the amide compounds that are believed to be suitable are included divinyl urea and the n-vinyl derivatives of formamide, caprolactam, pyrrolidone, and phthalimide.

As has been pointed out above, the instant formulations do not require the presence of any active-oxygen (i.e., peroxy group-containing), free-radical catalyst. Indeed, the incorporation of such compounds will usually be deleterious from the standpoints of reducing the pot-life of any component in which they are incorporated (sometimes causing the same to set-up immediately), producing degradation due to a continuing exotherm following initiation of polymerization, causing embrittlement of the deposit, etc.

It will often be highly desirable to include a photoinitiator in the formulation of the invention, and it will be self-evident that a photoinitiator will be prerequisite to certain applications; thus, as a practical matter, the formulation will usually include at least one photoinitiator. In those instances in which such an initiator is employed, the aromatic amine ingredient will serve a triple function; i.e., it cooperates to catalyze the surface curing reaction, it cooperates to catalyze the bulk-curing reaction, and it also improves the efficiency of photoinitiation. Although suitable photoinitiators will be apparent to those skilled in the art, specific illustrative compounds that might be identified are dimethoxy-2-phenylacetophenone (Ciba-Geigy Irgacure 651), 1-hydroxycyclohexylphenyl ketone (Ciba-Geigy Irgacure 184), and 2-hydroxy-2-methyl-1-phenylpropane-1-one (Ciba-Geigy Darocure 1173). A further listing may be obtained by reference to U.S. Pat. No. 4,820,744, particularly at line 43, column 4 through line 7, column 7. Cationic photoinitiators may also be employed, to provide a further cure mechanism in appropriate circumstances. When used, the photoinitiator will normally be incorporated in a concentration of 1 to 8, and preferably no more than 4, percent, based upon the weight of the formulation.

Particularly in instances in which the formulation is to be used as a potting compound, it may be especially desirable to incorporate a chain transfer agent of the kind that is typically used in compositions cured by electron beam initiation; e.g., halogen compounds, sulfur compounds, and secondary and tertiary aromatic hydrocarbons such as cumene, carbon tetrachloride, 1,4-disopropyl benzene, t-butyl benzene, bisphenol A and glycidyl ether derivatives thereof, etc. The use of chain transfer agents may serve to increase the Shore D hardness of the resultant polymer, the degree of which will depend to an extent upon the concentration of the agent in the formulation, which typically will be 0.5 to 5.0, and usually 0.1 to 1.0, weight percent.

Other materials may be incorporated into the instant compositions in addition to the components hereinabove described. For example, "inert" fillers such as wood flour, cornstarch, glass fibers, cotton linters, mica, alumina, silica, and the like, may be used to modify viscosity, improve impact resistance, and for other purposes, and it is conventional to include small percentages of silane coupling agents to increase moisture resistance as well as to enhance bond strength to glass and similar surfaces. The low-molecular weight reactive acids (such as acrylic and methacrylic), which may be employed as the acid ingredient of the catalyst system, also function as highly effective adhesion promoters, and consequently the effect of silanes and the like is regarded to be supplementary. Substances such as dyes, fluorescing agents, flame retarders, stabilizers (e.g., the quinones and hydroquinones), viscosity modifiers (thixotropes, thickeners, viscosity reducers), plasticizers, antioxidants, and the like, may be incorporated as well.

The formulation will usually be provided as two components that are so composed as to produce, in combination, the desired final properties of the cured deposit, coupled with satisfactory shelf-life and pot-life of the individual and mixed components, good rheological and flow characteristics, and other necessary or desirable properties. Although the formulation will normally be free of nonreactive solvents, it will be appreciated that small amounts of water and/or other solvents may necessarily be present as a practical matter, such as to facilitate the introduction of an ingredient (e.g., the metal compound, an acid, etc.). It will often be convenient to use a two-component formulation in a 1:1 volumetric ratio, especially in those instances in which automatic application (such as by the ultrasonic spraying technique referred to above) is to be employed, and the components will be formulated accordingly; other ratios may of course be preferred in given instances, and of course the formulation may be supplied as a multi-part composition if so desired.

Thus, it can be seen that the present invention provides a novel liquid formulation for producing a deposit in which both surface and also mass curing are achieved in a highly effective manner. The invention additionally provides a novel catalyst system, as well as a novel method for the production of an adherent, solid deposit in a highly facile and effective manner.

Having thus described the invention, what is claimed is:

1. A liquid formulation that is innately curable, in air, to a dry, adhesive solid, comprising: a polymerizable composition that includes at least one oxygen-containing ethylenically unsaturated polymerizable ingredient; a tertiary aromatic amine compound; an air-curing polyether-ene polymer containing at least three activated double bonds per molecule, said amine compound and said polyether-ene polymer being present in said formulation in a molar ratio of amine compound to polyether-ene polymer of less than 0.4:1.0; a transition metal compound; and an acid ingredient that is substantially soluble in said polymerizable composition and that forms a coordination compound with the metal of said metal compound, said formulation being devoid of any free-radical, active-oxygen polymerization catalyst, and of any acrylated carbonate polymer.

2. The formulation of claim 1 wherein said amine compound has the structural formula:

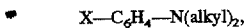

X—C$_6$H$_4$—N(alkyl)$_2$, in which the substituent X represents an electron-donating group and is in the ring position para or meta to the nitrogen atom, and in which each of the alkyl groups contains one to three carbon atoms.

3. The formulation of claim 2 wherein said substituent X is selected from the class consisting of t-butyl, methyl and methoxy groups, and the hydrogen atom.

4. The formulation of claim 1 wherein said amine compound:polyether-ene polymer ratio is in the range of 0.08 to 0.37:1.0.

5. The formulation of claim 1 wherein said amine compound is selected from the group consisting of N,N-dimethyl-p-toluidine, N,N-dimethyl-m-toluidine, N,N-dimethyl aniline, N,N-dimethyl benzophenone, p-tert-butyl-N,N-dimethyl aniline, and mixtures thereof.

6. The formulation of claim 1 wherein said polyether-ene polymer is an allyloxy compound.

7. The formulation of claim 6 wherein said allyloxy compound contains at least ten allyloxy groups in the molecule.

8. The formulation of claim 6 wherein said allyloxy compound has the structural formula:

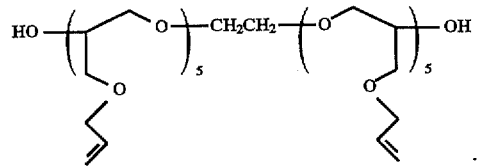

9. The formulation of claim 1 wherein said metal compound is a compound of a metal selected from the class consisting of cobalt, cerium, manganese and vanadium.

10. The formulation of claim 1 wherein said acid is a low molecular weight carboxylic acid selected from the class consisting of acrylic, methacrylic, acetic, ascorbic, oxalic, phthalic, itaconic, crotonic, 4-methoxyphenyl acetic, 3,5-dihydroxybenzoic, and 3,3-dimethylaminobenzoic acids.

11. The formulation of claim 1 wherein said polymerizable ingredient is an acrylate monomer.

12. The formulation of claim 1 wherein said polymerizable ingredient comprises a prepolymer selected from the group consisting of urethane (meth)acrylates, epoxy (meth) acrylates, and urethane epoxy-(meth)acrylates.

13. The formulation of claim 11 wherein said polymerizable composition comprises at least 20 weight percent of at least one acrylate monomer, and at least 20 weight percent of at least one prepolymer selected from said prepolymer group, based upon the weight of said formulation.

14. The formulation of claim 1 wherein the amount of said aromatic amine compound present in said formulation does not exceed 0.75 weight percent based upon the total weight of said formulation.

15. The formulation of claim 1 comprising, in percentages based upon the total weight thereof, 0.05 to 10 of said acid ingredient, 0.05 to 0.75 of said aromatic amine compound, 0.002 to 1.5 of said metal compound, 5 to 25 of said polyether-ene polymer, and 15 to 85 of said polymerizable composition.

16. The formulation of claim 1 wherein said formulation additionally includes an effective amount of a photoinitiator capable, when activated, of catalyzing polymerization of said polymerizable ingredient.

17. The formulation of claim 1 formulated as two components for admixture, one of said components containing substantially all of said amine compound and the other of said components containing substantially all of said acid ingredients.

18. As a polymerization catalyst system for a formulation that includes at least one oxygen-containing ethylenically unsaturated polymerizable ingredient, the combination consisting essentially of a tertiary aromatic amine compound; an air-curing polyether-ene polymer containing at least three activated double bonds per molecule, said amine compound and said polyether-ene polymer being present in said catalyst system in a molar ratio of amine compound to polyether-ene polymer of less than 0.4:1.0; a transition metal compound; an acid ingredient that is substantially soluble in the formulation and that forms a coordination compound with the metal of said metal compound; and, optionally, a photoinitiator that is capable, when activated, of catalyzing the polymerizable ingredient of such a formulation.

19. The system of claim 18 wherein said amine compound has the structural formula:

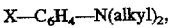

X—C$_6$H$_4$—N(alkyl)$_2$, in which the substituent X represents an electron-donating group and is in the ring position para or meta to the nitrogen atom, and in which each of the alkyl groups contains one to three carbon atoms.

20. The system of claim 19 wherein said substituent X is selected from the class consisting of t-butyl, methyl and methoxy groups, and the hydrogen atom.

21. The system of claim 18 wherein said amine compound:polyether-ene polymer ratio is in the range of 0.08 to 0.37:1.0.

22. The system of claim 18 wherein said amine compound is selected from the group consisting of N,N-dimethyl-p-toluidine, N,N-dimethyl-m-toluidine, N,N-dimethyl aniline, N,N-dimethyl benzophenone, p-tert-butyl-N,N-dimethyl aniline, and mixtures thereof.

23. The system of claim 18 wherein said polyether-ene polymer is an allyloxy compound.

24. The system of claim 23 wherein said allyloxy compound contains at least ten allyloxy groups in the molecule.

25. The system of claim 24 wherein said allyloxy compound has the structural formula:

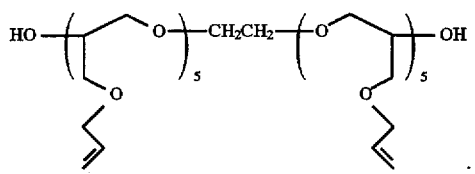

26. The system of claim 18 wherein said metal compound is a compound of a metal selected from the class consisting of cobalt, cerium, manganese and vanadium.

27. The system of claim 18 wherein said acid is a low molecular weight carboxylic acid selected from the class consisting of acrylic, methacrylic, acetic, ascorbic, oxalic, phthalic, itaconic, crotonic, 4-methoxyphenyl acetic, 3,5-dihydroxybenzoic, and 3,3-dimethylaminobenzoic acids.

28. The system of claim 18 wherein said formulation includes an effective amount of such a photoinitiator.

29. In a method for the production of an adherent solid deposit upon a substrate, the steps comprising:

(a) providing liquid formulation that is innately curable to an adhesive solid, comprising a polymerizable composition that includes at least one oxygen-containing ethylenically unsaturated polymerizable ingredient; a tertiary aromatic amine compound; an air-curing polyether-ene polymer containing at least three activated double bonds per molecule, said amine compound and said polyether-ene polymer being present in said formulation in a molar ratio of amine compound to polyether-ene polymer of less than 0.4:1.0; a transition metal compound; and an acid ingredient that is substantially soluble in said polymerizable composition and that forms a coordination compound with the metal of said metal compound, said formulation being devoid of any free-radical, active-oxygen polymerization catalyst, and of any acrylated carbonate polymer;

(b) forming a liquid deposit of said formulation upon a substrate; and (c) effecting curing of said liquid deposit to produce an adherent solid deposit on said substrate.

30. The method of claim 29 wherein said curing step (c) is carried out in the presence of oxygen.

31. The method of claim 29 wherein said amine compound has the structural formula:

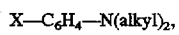

in which the substituent X represents an electron-donating group and is in the ring position para or meta to the nitrogen atom, and in which each of the alkyl groups contains one to three carbon atoms.

32. The method of claim 31 wherein said substituent X is selected from the class consisting of t-butyl, methyl and methoxy groups, and the hydrogen atom.

33. The method of claim 29 wherein said amine compound:polyether-ene polymer ratio is in the range of 0.08 to 0.37:1.0.

34. The method of claim 29 wherein said polyether-ene polymer is an allyloxy compound.

35. The method of claim 34 wherein said allyloxy compound has the structural formula:

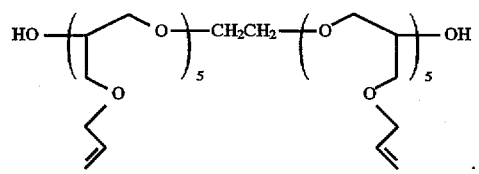

36. The method of claim 29 wherein said metal compound is a compound of a metal selected from the class consisting of cobalt, cerium, manganese and vanadium.

37. The method of claim 29 wherein said polymerizable ingredient comprises a prepolymer selected from the group consisting of urethane (meth)acrylates, epoxy (meth)acrylates, and urethane epoxy-(meth)acrylates.

38. The method of claim 29 wherein said formulation additionally includes an effective amount of a photoinitiator capable, when activated, of catalyzing polymerization of said polymerizable ingredient, and wherein said curing step (c) is initiated, in part, by exposure of said liquid deposit to actinic radiation for said photoinitiator.

39. The method of claim 29 wherein, in said formulation, said acid ingredient is selected from the class consisting of acrylic, methacrylic and acetic acids, and mixtures thereof, wherein said amine compound is selected from the group consisting of N,N-dimethyl-p-toluidine and p-tert-butyl-N,N-dimethyl aniline, and mixture thereof, and wherein said metal compound is a compound of cobalt.

* * * * *